(12) United States Patent
Jilani et al.

(10) Patent No.: US 7,623,142 B2
(45) Date of Patent: Nov. 24, 2009

(54) FLEXURE

(75) Inventors: Adel Jilani, Corvallis, OR (US);
Charles Gustav Schmidt, Corvallis, OR (US); Kenneth James Faase, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 982 days.

(21) Appl. No.: 10/940,948

(22) Filed: Sep. 14, 2004

(65) Prior Publication Data

US 2006/0056004 A1 Mar. 16, 2006

(51) Int. Cl.
*G02B 26/00* (2006.01)
*G02F 1/03* (2006.01)
*G11B 5/48* (2006.01)

(52) U.S. Cl. .................. 345/903; 345/905; 359/237; 359/242; 359/245; 359/291; 360/245.8; 360/123.36

(58) Field of Classification Search ......... 359/237–242, 359/223–225, 244–247, 291–295, 325, 344, 359/357; 29/603.03, 603.04; 372/107, 36, 372/15, 30, 95, 99, 103; 360/103–104, 245.8, 360/119.01, 123.36, 123.35; 310/6, 15–17; 60/517, 520; 137/529, 540; 345/31–32, 345/903, 905; 313/364
See application file for complete search history.

(56) References Cited

U.S. PATENT DOCUMENTS

| | | | |
|---|---|---|---|
| 3,886,310 A | 5/1975 | Guldberg et al. | |
| 3,977,009 A | 8/1976 | Ohtsuka et al. | |
| 4,030,813 A | 6/1977 | Kohashi et al. | |
| 4,317,611 A | 3/1982 | Petersen | |
| 4,394,405 A * | 7/1983 | Atherton | 427/58 |
| 4,615,595 A | 10/1986 | Hornbeck | |
| 4,662,746 A | 5/1987 | Hornbeck | |
| 4,747,670 A | 5/1988 | Devio et al. | |
| 5,061,049 A | 10/1991 | Hornbeck | |
| 5,083,857 A | 1/1992 | Hornbeck | |
| 5,096,279 A | 3/1992 | Hornbeck et al. | |
| 5,157,541 A | 10/1992 | Schildkraut et al. | |
| 5,170,283 A | 12/1992 | O'Brien et al. | |
| 5,177,348 A | 1/1993 | Laor | |
| 5,212,582 A | 5/1993 | Nelson | |
| 5,216,537 A | 6/1993 | Hornbeck | |
| 5,233,456 A | 8/1993 | Nelson | |
| 5,275,055 A | 1/1994 | Zook et al. | |
| 5,293,511 A | 3/1994 | Poradish et al. | |
| 5,312,513 A | 5/1994 | Florence et al. | |
| 5,325,228 A | 6/1994 | Matsubara et al. | |
| 5,331,454 A | 7/1994 | Hornbeck | |
| 5,355,534 A | 10/1994 | Kimura | |
| 5,378,954 A | 1/1995 | Higuchi et al. | |
| 5,382,961 A | 1/1995 | Gale, Jr. | |
| 5,392,151 A | 2/1995 | Nelson | |
| 5,414,552 A | 5/1995 | Godil | |
| 5,432,611 A | 7/1995 | Haneda et al. | |

(Continued)

FOREIGN PATENT DOCUMENTS

JP 5022960 1/1993

*Primary Examiner*—Sajous Wesner (57) ABSTRACT

An apparatus includes a first member, a second member and a flexure. The flexure has a central portion connected to the first member, outer portions connected to the second member and an intermediate portion spaced from the first member and the second member.

53 Claims, 7 Drawing Sheets

U.S. PATENT DOCUMENTS

| | | | |
|---|---|---|---|
| 5,444,566 A | 8/1995 | Gale et al. | |
| 5,485,437 A | 1/1996 | Gregg | |
| 5,521,452 A | 5/1996 | Gregg | |
| 5,524,153 A | 6/1996 | Laor | |
| 5,534,740 A | 7/1996 | Higuchi et al. | |
| 5,539,568 A | 7/1996 | Lin et al. | |
| 5,621,829 A | 4/1997 | Ford | |
| 5,629,794 A | 5/1997 | Magel et al. | |
| 5,745,281 A | 4/1998 | Yi et al. | |
| 5,780,948 A | 7/1998 | Lee et al. | |
| 5,796,152 A | 8/1998 | Carr et al. | |
| 5,808,780 A | 9/1998 | McDonald | |
| 5,862,003 A | 1/1999 | Saif et al. | |
| 5,908,986 A | 6/1999 | Mitamura | |
| 5,963,367 A | 10/1999 | Aksyuk et al. | |
| 5,986,381 A | 11/1999 | Hoen et al. | |
| 5,994,750 A | 11/1999 | Yagi | |
| 6,025,951 A | 2/2000 | Swart et al. | |
| 6,081,544 A * | 6/2000 | Zamel et al. | 372/107 |
| 6,087,747 A | 7/2000 | Dhuler et al. | |
| 6,249,073 B1 | 6/2001 | Nguyen et al. | |
| 6,257,739 B1 | 7/2001 | Sun et al. | |
| 6,268,908 B1 | 7/2001 | Bula et al. | |
| 6,275,320 B1 | 8/2001 | Dhuler et al. | |
| 6,278,337 B1 | 8/2001 | Chan et al. | |
| 6,301,000 B1 | 10/2001 | Johnson | |
| 6,301,403 B1 | 10/2001 | Heanue et al. | |
| 6,307,298 B1 | 10/2001 | O'Brien | |
| 6,308,573 B1 | 10/2001 | Lee et al. | |
| 6,323,982 B1 | 11/2001 | Hornbeck | |
| 6,324,748 B1 | 12/2001 | Dhuler et al. | |
| 6,329,738 B1 | 12/2001 | Hung et al. | |
| 6,355,534 B1 | 3/2002 | Cheng et al. | |
| 6,392,220 B1 | 5/2002 | Slater et al. | |
| 6,424,504 B1 | 7/2002 | Abe et al. | |
| 6,449,081 B1 | 9/2002 | Onuki et al. | |
| 6,465,355 B1 | 10/2002 | Horsley | |
| 6,472,794 B1 | 10/2002 | Shibaike et al. | |
| 6,495,944 B2 | 12/2002 | Hirano et al. | |
| 6,509,998 B2 | 1/2003 | Huang et al. | |
| 6,531,804 B2 | 3/2003 | Kasahara | |
| 6,541,892 B2 | 4/2003 | Hoen | |
| 6,545,385 B2 | 4/2003 | Miller et al. | |
| 6,552,837 B2 | 4/2003 | Mirshekar-Syahkal et al. | |
| 6,625,343 B2 | 9/2003 | Kato | |
| 6,628,039 B2 | 9/2003 | Dhuler | |
| 6,657,359 B1 | 12/2003 | Hoen et al. | |
| 6,664,706 B1 | 12/2003 | Hung et al. | |
| 6,666,561 B1 | 12/2003 | Blakley | |
| 6,677,695 B2 | 1/2004 | Dhuler et al. | |
| 6,724,785 B1 | 4/2004 | Tucker et al. | |
| 6,734,598 B2 | 5/2004 | Shibaike et al. | |
| 6,744,805 B2 | 6/2004 | Wang et al. | |
| 6,747,785 B2 | 6/2004 | Chen et al. | |
| 6,813,520 B2 * | 11/2004 | Truckai et al. | 607/101 |
| 6,870,659 B2 * | 3/2005 | Aubuchon | 359/291 |
| 7,230,749 B2 * | 6/2007 | Martin | 359/291 |
| 2002/0034051 A1* | 3/2002 | Hagen | 360/245.3 |
| 2002/0189688 A1* | 12/2002 | Roorda | 137/529 |
| 2003/0005767 A1* | 1/2003 | Hulsing, II | 73/514.02 |
| 2004/0070040 A1 | 4/2004 | Aubuchon | |
| 2004/0070815 A1 | 4/2004 | Aubuchon | |
| 2004/0120078 A1* | 6/2004 | Berding et al. | 360/245.9 |
| 2004/0136076 A1 | 7/2004 | Tayebati | |
| 2004/0261544 A1* | 12/2004 | Peshkin | 73/862.53 |
| 2005/0202585 A1* | 9/2005 | Eskridge | 438/50 |
| 2007/0052144 A1* | 3/2007 | Knirck et al. | 267/160 |

* cited by examiner

FLEXURE

BACKGROUND

Flexures are utilized in micro electromechanical systems (MEMS) to movably support one member relative to another member. For example, flexures have been utilized to support micro mirrors of light modulators in various displays or projectors. The current flexure designs suffer from complex manufacturing and fatigue due to high internal strains and a limited range of stable motion.

DETAILED DESCRIPTION OF EXAMPLE EMBODIMENTS

Figure 1:
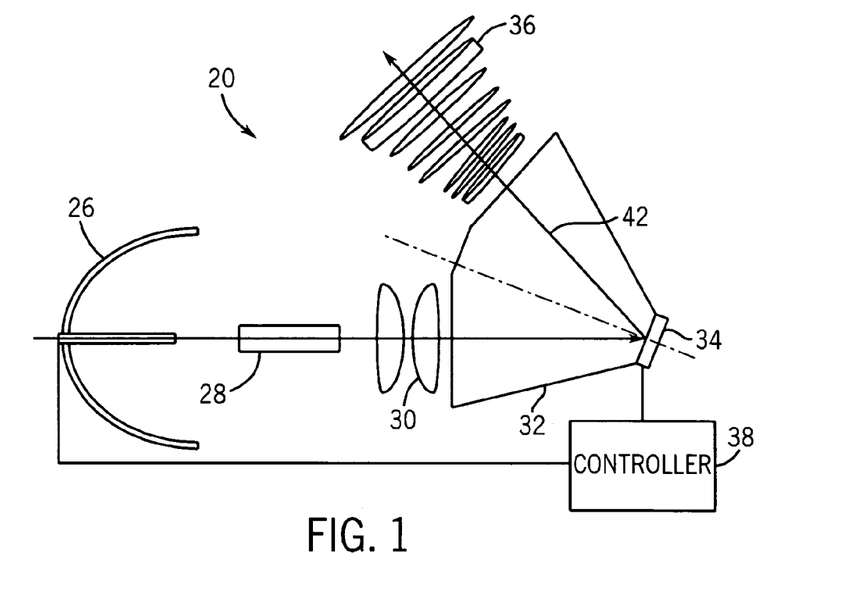
FIG. 1 is a schematic illustration of a display system including a light modulator according to one exemplary embodiment.

FIG. 1 schematically illustrates one example of an electronic device (shown as a display system 20) including light modulator 34. In addition to light modulator 34, display system 20 includes light source 26, integrator 28, condenser lens 30, prism 32, projection lens 36 and controller 38. Light source 26 directs light towards modulator 34. Integrator 28 integrates the light. Condenser lens 30 condenses the light such that the light travels through prism 32 and onto modulator 34.

Modulator 34 may comprise a micro-machine light modulator including electro-statically actuated optical cavities. Modulator 34 varies intensity and color modulation within each of a plurality of pixels. As will be described in greater detail hereafter, each pixel acts as a Fabry-Perot filter including a partial reflecting film, a tunable optical cavity and a strongly reflecting film. By controlling the size of each optical cavity, hues and intensities can be modulated without resorting to color wheels, dedicated pixels for each primary hue or polarized light. Interference from the two reflectors causes a narrow band filter that is used to select primary colors by varying the gap between the reflectors. The gap is controlled by balancing a flexure force and an electrostatic force between the two reflectors. As the gap is narrowed, absorption occurs and a black state can be achieved.

As indicated by arrow 42, light reflected from modulator 34 passes through prism 32 and through projection lens 36. Projection lens 36 comprises a series of one or more optical lenses which focus and direct the light reflected from modulator 34 onto a display surface (not shown).

Controller 38 comprises a processor unit configured to generate control signals to direct the operation of at least light source 26 and modulator 34. For purposes of the disclosure, the term "processor unit" shall mean a conventionally known or future developed processing unit that executes sequences of instructions contained in a memory. Execution of the sequences of instructions causes the processing unit to perform steps such as generating control signals. The instructions may be loaded in a random access memory (RAM) for execution by the processing unit from a read only memory (ROM), a mass storage device, or some other persistent storage. In other embodiments, hardwired circuitry may be used in place of or in combination with software instructions to implement the functions described. Controller 38 is not limited to any specific combination of hardware circuitry and software, nor to any particular source for the instructions executed by the processing unit.

In the particular embodiment shown, controller 38 generates control signals based upon received image data. The control signals tune the optical cavities of the individual pixels based upon the image data such that the light reflected from modulator 34 has a hue and intensity matching the image to be displayed. This reflected light is further refined by projection lens 36.

Although modulator 34 is illustrated as being incorporated into a display system 20 which comprises a projector, modulator 34 may alternatively be incorporated into other display systems such as wearable displays, cameras, cell phones, electronic paper, personal data assistants (PDAs), and the like.

Figure 2:
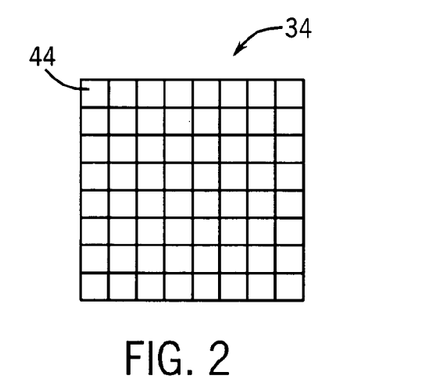
FIG. 2 is a schematic illustration of the light modulator of FIG. 1 according to one exemplary embodiment.
Figure 3:
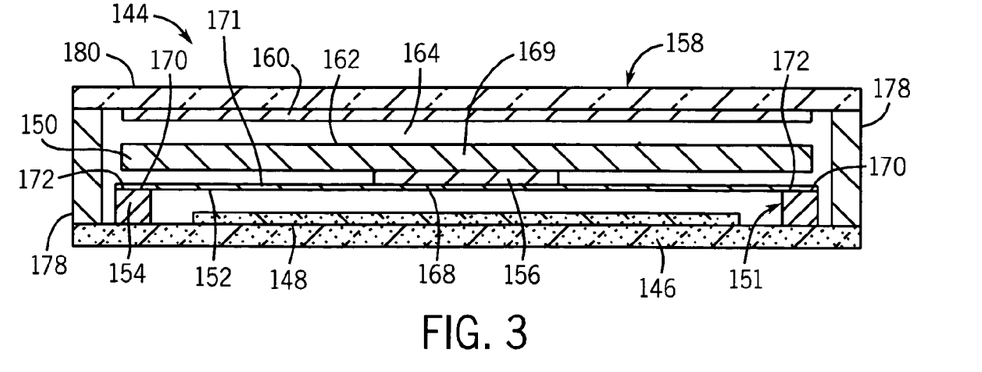
FIG. 3 is a sectional view schematically illustrating a pixel of the light modulator of FIG. 2 according to one exemplary embodiment.
Figures 4, 5:
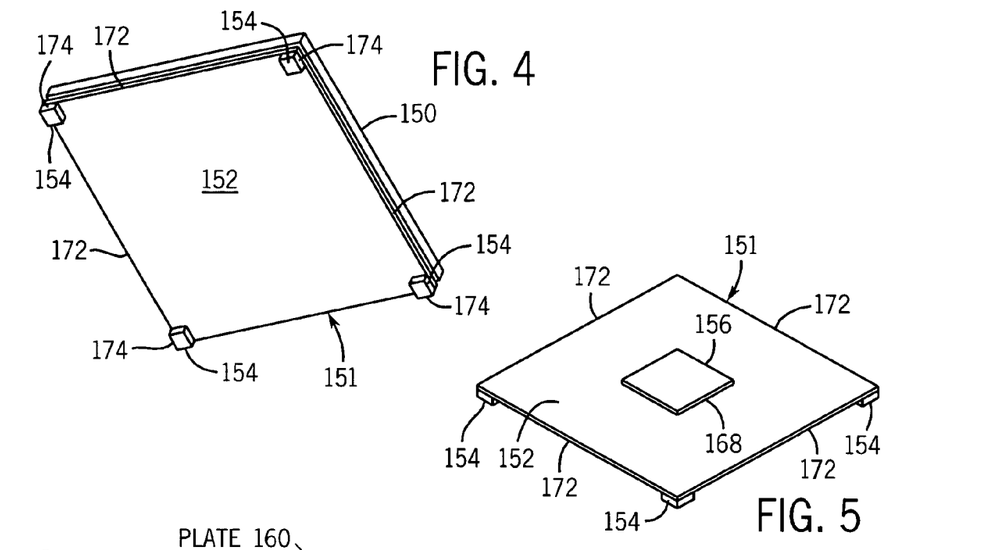
FIG. 4 is a bottom perspective view of a flexure system attached to a pixel plate of the pixel of FIG. 3 according to one exemplary embodiment.
FIG. 5 is a top perspective view of the flexure system of the pixel of FIG. 3 according to one exemplary embodiment.

As shown by FIG. 2, modulator 34 includes an array of cells or pixels 44. FIGS. 3-5 illustrate pixel 144, one example of pixel 44 shown in FIG. 2. As shown by FIG. 3, pixel 144 includes substrate 146, bottom plate 148, pixel plate 150, flexure system 151 including flexure 152, outer posts 154 and central post 156, upper support 158 and top plate 160. Substrate 146 serves as a base or foundation for pixel 144. In particular embodiments, substrate 146 may be formed as part of a larger member or wafer serving as a foundation for a plurality of pixels 144. In one embodiment, substrate 146 comprises silicon. In other embodiments, other materials may be used for substrate 146 such as glass, alumina, or silica.

Bottom plate 148 comprises a layer of electrically conductive material capable of retaining charge so as to create an electrostatic field. Bottom plate 148 extends on substrate 146 generally opposite to pixel plate 150 and plate 160. In one embodiment, bottom plate 148 comprises TaAl. In other embodiments, other materials such as a wide range of metals, alloys, and intermetallics may be used.

Pixel plate 150 comprises a relatively rigid member having a reflective surface 162. In the particular embodiment shown, pixel plate 150 has a reflective surface 162 with a reflectivity of at least 90 percent. Pixel plate 150 partially forms an optical cavity 164 located between surface 162 and top plate 160. Pixel plate 150 is movably supported by flexure 152. Movement of pixel plate 150 relative to top plate 160 adjusts or tunes a thickness of optical cavity 164 to vary optical interference within cavity 164 and to vary the intensity and color of light ultimately reflected from pixel 144. In the particular embodiment illustrated, surface 162 of pixel plate 150 is provided by AlCu. In other embodiments, other materials may be used to provide the reflective surface of pixel plate 150 such as Al, Ag, Au and their alloys, dielectric and metal/dielectric composite thin film stacks. In the particular example shown, pixel plate 150 and reflective surface 162 are generally rectangular, and nominally square in shape. In other embodiments, pixel plate 150 and surface 162 may have other shapes.

Flexure system 151 movably supports pixel plate 150 relative to plate 160 to vary optical cavity 164. Flexure system 151 includes flexure 152, outer posts 154 and central posts 156. Flexure 152 movably supports pixel plate 150 relative to substrate 146. Flexure 152 is formed from a material and has appropriate dimensions so as to flex towards and away from plate 160. In the embodiment shown, flexure 152 comprises a flexible membrane, a thin pliable sheet of one or more materials. In one embodiment, flexure 152 generally has a stiffness of no greater than 15 micro newtons per micrometer. In one embodiment, flexure 152 has a minimum stiffness of at least 7 micro newtons per micrometer. In one particular embodiment, flexure 152 is formed from TaAl. In other embodiments, flexure 152 may be formed from other materials such as a wide range of metals, alloys, and intermetallics. In one embodiment, flexure 152 has a thickness of between about 200 angstroms and 600 angstroms. Flexure 152 generally extends between substrate 146 and pixel plate 150.

Flexure 152 has a central portion 168 connected to pixel plate 150 and outer portions 170 connected to an underlying support. Intermediate portions 171, located between central portions 168 and outer portions 170, are spaced from both plate 150 and the underlying support in a direction perpendicular to the flexure 152. Outer portions 170 are those portions of flexure 152 which are located outwardly beyond central portion 168. Central portion 168 comprises that portion of flexure 152 which is substantially centrally located or substantially equidistantly spaced from each side or peripheral edge of flexure 152. Outer portion 170 is not limited to those portions of flexure 152 along or adjacent to the outer periphery or edge 172 of flexure 152, but may instead be located between central portion 168 and the outer edge or periphery 172 of flexure 152. In the particular embodiment shown, outer portions 170 are connected directly to substrate 146. In other embodiments, outer portions 170 may be indirectly connected to substrate 146 by intermediate structures such as by portions of bottom capacitor plate 148.

In the particular embodiment shown, central portion 168 is connected to a central portion 169 of pixel plate 150 on a side of pixel plate 150 opposite to reflective surface 162. In other embodiments, central portion 168 of flexure 152 may be connected to other portions of pixel plate 150.

Outer posts 154 connect flexure 152 to substrate 146 or other underlying structures. In particular, outer posts 154 connect outer portions 170 of flexure 152 to substrate 146 or other underlying structures. FIG. 4 illustrates one example of outer posts 154. As shown by FIG. 4, outer posts 154 are spaced from one another and are positioned adjacent to the outer edges 172 of flexure 152. In the particular example shown, outer posts 154 are connected to flexure 152 in each of four corners of flexure 152. Because outer posts 154 are connected to flexure 152 at its outer edges 172 and in each of its corners 174, central portion 168 of flexure 152 has a greater range of motion, providing pixel plate 150 with a greater range of motion. Because outer posts 154 are located in each of the corners 174 of flexure 152, outer posts 154 are generally equidistantly spaced from central portion 168 to provide stable, uniform movement of central portion 168 of flexure 152 and stable and uniform movement of pixel plate 150. In other embodiments, outer posts 154 may be connected to other outer portions of flexure 152.

Outer posts 154 serve as spacers by spacing flexure 152 from substrate 146 and top plate 148. In one embodiment, outer posts 154 space flexure 152 from bottom plate 148 by a distance of at least about 2000 A and nominally about 6000-8000 A. These dimensions are example dimensions, other dimensions may be employed in alternate embodiments. In one embodiment, outer posts 154 are integrally formed as a single unitary body out of the same material as flexure 152. In other embodiments, outer posts 154 may be mounted to flexure 152 or may be integrally formed as part of a single unitary body out of the same material with substrate 146 or bottom plate 148.

Central post 156 connects central portion 168 of flexure 152 to pixel plate 150. In the particular example shown, central post 156 connects flexure 152 to central portion 169 of pixel plate 150. At the same time, central post 156 serves as a spacer by spacing flexure 152 from pixel plate 150. In one embodiment, central post 156 spaces flexure 152 from pixel plate 150 by a distance of at least about 2000 A and nominally about 6000-8000 A. These dimensions are example dimensions, other dimensions may be employed in alternate embodiments.

FIG. 5 illustrates central post 156 in greater detail. As shown by FIG. 5, central post 156 is connected to central portion 168 of flexure 152. Central post 156 is equidistantly spaced from sides or edges 172 of flexure 152. In one embodiment, central post 156 is integrally formed as part of a single unitary body with pixel plate 150. In one embodiment, central post 156 is integrally formed as part of a single unitary body out of the same material as pixel plate 150. In other embodiments, central post 156 may be integrally formed as part of a single unitary body out of the same material as flexure 152 or may be mounted to one or both of flexure 152 and pixel plate 150.

In the particular embodiment illustrated, central post 156 has a shape which corresponds to the shape of flexure 162. As a result, movement of pixel plate 150 is more uniform and stable. In other embodiments, central post 156 may have other shapes.

Support 158 generally comprises one or more structures elevating plate 160 relative to reflective surface 162 of pixel plate 150. In the particular embodiment shown, support 158 is substantially transparent and extends over the plate 160 while elevating top plate 160 relative to pixel plate 150. In the particular embodiment illustrated, support 158 includes a plurality of posts 178 which support an overlying panel 180 that is connected to plate 160. Posts 178 are spaced about a perimeter of panel 180 which generally extends opposite pixel plate 150. In other embodiments, panel 180 may be elevated by continuous rings which extend about individual pixel plates 150, by rings which extend around sets of multiple pixel plates 150 or by other structures. In still other embodiments, support 158 may alternatively be coupled to peripheral edge of plate 160 rather than extending over plate 160.

Plate 160 generally comprises a layer of semi-reflective, semi-transparent material suspended relative to reflective surface 162 of pixel plate 150 to form optical cavity 164. Plate 160 cooperates with reflective surface 162 to defract light so as to alter the wavelength of the light and to change its intensity and color. In the particular embodiment shown, plate 160 is additionally electrically conductive and configured to retain charge, enabling plate 160 to be electrically biased to a voltage or charge to electrostatically actuate pixel plate 150 and to adjust optical cavity 164. In other embodiments, plate 160 may alternatively be formed from nonconductive materials, wherein pixel plate 150 is actuated towards and away from plate 160 using other actuation means such as by only electrically biasing one or both of pixel plate 150 and bottom plate 148 or by other actuation mechanisms. In the particular embodiment illustrated, plate 160 is formed from TaAl. In other embodiments, plate 160 may be formed from other materials such as a wide range of metals, alloys, and intermetallics.

Figure 6:
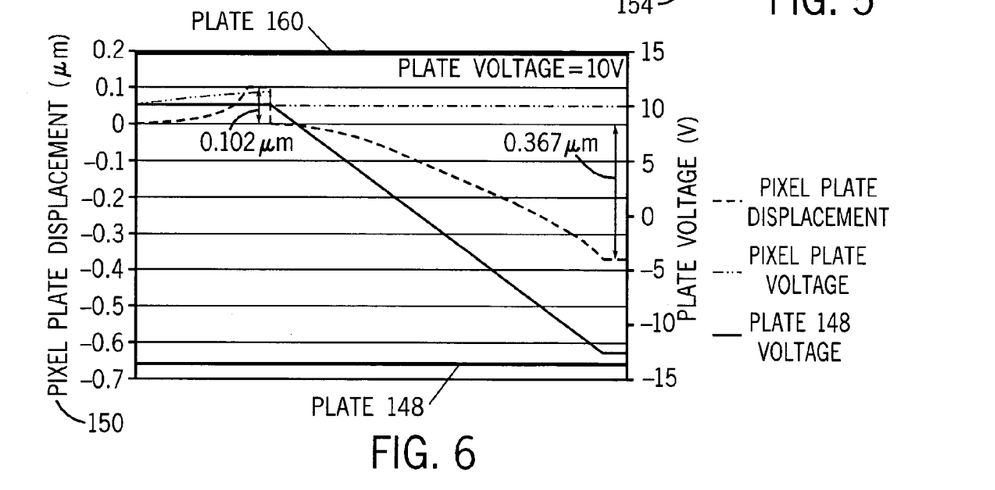
FIG. 6 is a graph illustrating one scheme of operation for the pixel of FIG. 3 according to one exemplary embodiment.
Figure 7:
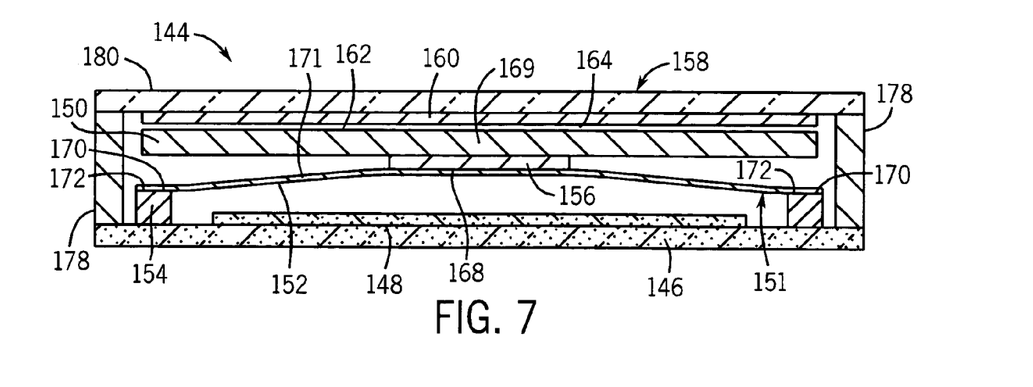
FIG. 7 is a sectional view of the pixel of FIG. 3 illustrating actuation of the pixel plate in a first direction according to one exemplary embodiment.
Figure 8:
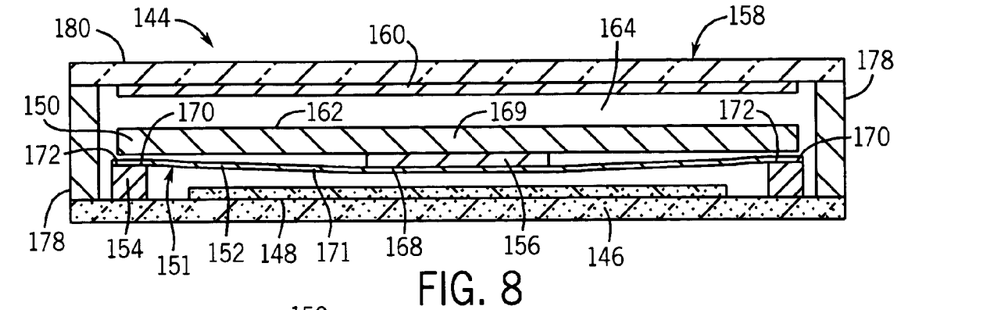
FIG. 8 is a sectional view of the pixel of FIG. 3 illustrating actuation of the pixel plate in a second opposite direction according to one exemplary embodiment.

FIGS. 6-8 illustrate the operation of pixel 144. FIG. 6 is a graph depicting displacement of pixel plate 150 in response to the biasing of plates 148, 150 and 160 to selected voltages. In the example shown in FIG. 6, flexure 152 is formed from TaAl with a thickness of approximately 0.05 micrometers, a surface area of approximately 20×20 micrometers and a residual stress of about 20 MPa. Pixel plate 150 is formed from AlCu and is provided with a residual stress of 200 MPa. Reflective surface 162 of pixel plate 150 is spaced from plate 160 by about 0.2 micrometers, while the lower surface of pixel plate 150 is spaced from plate 148 by about 0.66 micrometers. Pixel plate 150 has a thickness of about 1 micrometer.

As shown by FIG. 6 and FIG. 7, plates 148, 150 and 160 are initially set at 10 volts. Pixel plate 150 is moved towards plate 160 by ramping pixel plate 150 up to 11.1 volts while the voltages of plates 148 and 160 are kept at 10 volts. This results in an induced upward displacement of pixel plate 150 by approximately 0.1025 micrometers (approximately 51% of the total upper electrostatic gap and the thickness of optical cavity 164).

As shown by FIGS. 6 and 8, pixel plate 150 is displaced downward towards plate 148 by resetting the voltage of pixel plate 150 to 10 volts, while the voltage of plate 148 is ramped down to negative 10.4 volts to induce a downward displacement of approximately 0.368 micrometers (approximately 56% of the total lower electrostatic gap between an underside of pixel plate 150 and plate 48). In both scenarios, contact between pixel plate 150 and plates 148, 160 is avoided.

Although not illustrated, various other techniques may be employed for displacing pixel plate 150 towards and away from plate 160 to vary the thickness of optical cavity 164 and to vary the resulting light emitted from pixel 144. For example, in lieu of maintaining plate 160 at a constant voltage while adjusting the voltage of plates 148 and 150, plate 150 may be maintained at a constant voltage, while the voltages of plates 148 and 160 are varied, plate 148 may be maintained at a constant voltage while the voltages of plate 150 and plate 160 are varied. For purposes of this disclosure, a voltage may have a zero value, a positive value or a negative value.

Overall, in some embodiments, flexure 152, outer posts 154 and central post 156 of flexure system 151 movably support pixel plate 150 with a reduced risk of stiction and with lesser induced strains in the flexure itself. The flexure arrangement provided by flexure 152, outer post 154 and central post 156 enables controlled movement of pixel plate 150 through a large fraction (approximately 50-60%) of the total electrostatic gap (i.e., the distance between plates 148 and 160) without any significant contact between pixel plate 150 and plate 160 or between flexure 152 and plate 148. The flexure arrangement enables pixel plate 150 to be pulled upward towards plate 160 to within 1,000 angstroms of plate 160 to achieve the display of a black color without losing significant pixel stability and without significant contact between pixel plate 150 and plate 160. In addition, because movement of pixel plate 150 downward towards plate 148 is approximately linear for about 50-60% of the total electrostatic gap between plates 148 and 150, the flexure arrangement provides for stability and control of the movement of pixel plate 150 and for control over the color of light emitted from pixel 144.

Moreover, the flexure arrangement provided by flexure 152, outer post 154 and central post 156 incurs low induced strains. In the particular example shown, discrepancies in residual strains do not cause flexure 152 to be significantly overstrained as pixel plate 150 is substantially free to shrink or expand without significant constraints such as attachment to flexure 152 at its central portion 169. In addition, because posts 154 are outwardly arranged with respect to central post 156, post 154 and post 156 do not directly overlie one another. As a result, the manufacturing of pixel 144 is simplified.

Figure 9:
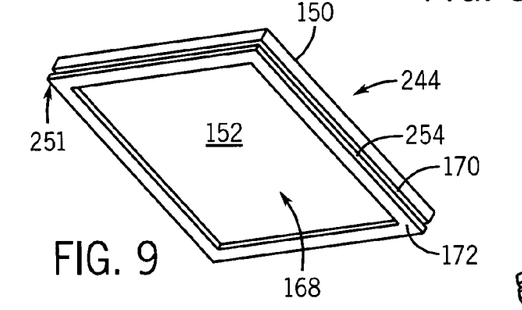
FIG. 9 is a bottom perspective view of another embodiment of the flexure system of FIG. 4 attached to a pixel plate according to one exemplary embodiment.

FIGS. 9-13 illustrate other embodiments of pixel 44. FIG. 9 illustrates pixel 244. Pixel 244 is similar to pixel 144 except that pixel 244 includes flexure system 251 in lieu of flexure system 151. For ease of illustration, FIG. 9 omits substrate 146, plate 148, central support or post 156, support 158 and plate 160. Flexure system 251 is similar to flexure system 151 except that flexure system 251 includes outer post 254 in lieu of outer posts 154. As shown by FIG. 9, outer post 254 comprises a continuous pedestal or rim extending about central portion 168 of flexure 152. As a result, all outer portions 170 along edges 172 of flexure 152 are clamped or connected to substrate 146 (shown in FIG. 3).

Figure 10:
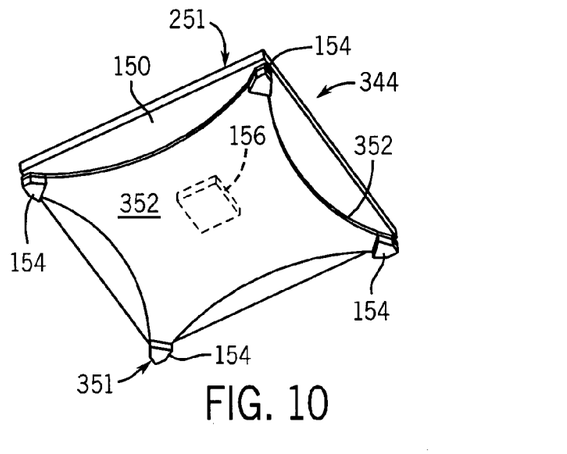
FIG. 10 is a bottom perspective view of another embodiment of the flexure system of FIG. 4 attached to the pixel plate according to one exemplary embodiment.

FIG. 10 illustrates pixel 344 and flexure system 351. Pixel 344 is similar to pixel 144 except that pixel 344 includes flexure system 351 in lieu of flexure system 151. For ease of illustration, FIGS. 10 and 11 omit illustrating substrate 146, plate 148, support 156, support 158 and plate 160. As shown by FIG. 10, flexure system 351 has a flexure 352 that is similar to flexure 152 except that flexure 352 has a hypocycloid shape in lieu of a rectangular shape. Due to its hypocycloid shape, induced strains at the attachments of flexure 352 to posts 154 are reduced.

Figure 11:
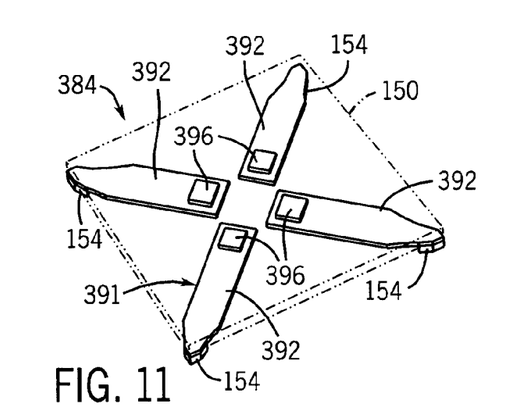
FIG. 11 is a top perspective view of another embodiment of the flexure system of FIG. 4 attached to the pixel plate according to one exemplary embodiment.

FIG. 11 illustrates pixel 384 and flexure system 391. Pixel 384 is similar to pixel 144 except that pixel 384 includes flexure system 391 in lieu of flexure system 151. For ease of illustration, FIG. 11 omits illustrating substrate 146, plate 148, support 156, support 158 and plate 160. As shown by FIG. 11, flexure system 391 includes four flexures 392. Each flexure 392 is an elongate leg having an outer portion connected to an outer post 154 which is to be connected to an underlying support structure such as substrate 146 or plate 148 (shown in FIG. 3) and an inner end or central portion connected to a central post 396 which is connected to a central portion of pixel plate 150 (shown in phantom). Posts 154 space flexures 392 from the underlying support structure such as substrate 146 or plate 148 while posts 396 space flexures 392 from pixel plate 150. Each of flexures 392 has an intermediate portion spaced from the underlying support structure such as substrate 146 or plate 148 and spaced from pixel plate 150 in a direction perpendicular to flexures 392. Flexures 392 are configured and made of an appropriate material so as to flex and movably support pixel plate 150.

Although flexures 392 are illustrated as extending generally parallel to plate 150, in other embodiments, flexures 392 may extend oblique relative to plate 150. Although flexures 392 are illustrated as comprising generally distinct legs, in other embodiments, flexures 392 may alternatively be interconnected to one another at their inner or central ends. Although flexure system 391 is illustrated with the inner or central ends of flexures 392 being connected to pixel plate 150 and the outer ends being connected to the underlying support structure, in other embodiments, the outer ends of flexures 392 may alternatively be connected to outer portions of pixel plate 150 while the inner or central portions of flexures 392 are connected to the underlying support structure.

Figure 12:
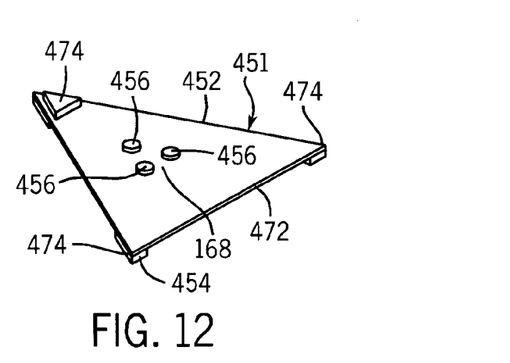
FIG. 12 is a top perspective view of another embodiment of the flexure system of FIG. 5 according to one exemplary embodiment.
Figure 13:
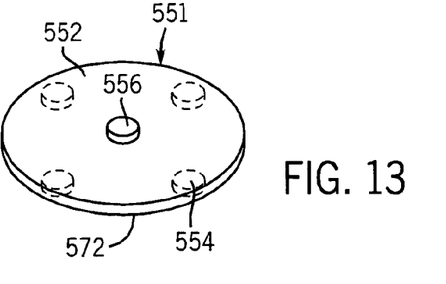
FIG. 13 is a top perspective view of another embodiment of the flexure system of FIG. 5 according to one exemplary embodiment.

FIGS. 12 and 13 illustrate still additional embodiments of flexure system 151. FIG. 12 illustrates flexure system 451 having flexure 452, outer posts 454 and central posts 456. Flexure 452 is similar to flexure 152 except that flexure 452 is triangular shaped. Outer posts 454 are located at each of the three corners of flexure 452 and connect flexure 452 to an underlying structure, such as substrate 146 (shown in FIG. 3). Central posts 456 extend from an opposite side of flexure 452 and are configured to connect central portion 168 to central portion 169 of pixel plate 150 (shown in FIG. 3). Central posts 456 are each equally spaced from their respective corners of flexure 452. In other embodiments, a single central post, two central posts or greater than three central posts may alternatively be used to connect a central portion 168 of flexure 452 to pixel plate 150 (shown in FIG. 3).

FIG. 13 illustrates flexure system 551 having flexure 552, outer posts 554 and central posts 556. Flexure 552 is similar to flexure 152 except that flexure 552 is circular. Outer posts 554 extend from one side of flexure 552 and are configured to connect flexure 552 to an underlying structure such as substrate 146. Central post 556 extends from the other side of flexure 552 and is configured to connect flexure 552 to a central portion 169 of pixel plate 150 (shown in FIG. 3). In the particular example shown, outer posts 554 are uniformly and equidistantly spaced about central post 556 adjacent to edge 572 of flexure 552.

Figure 14A:
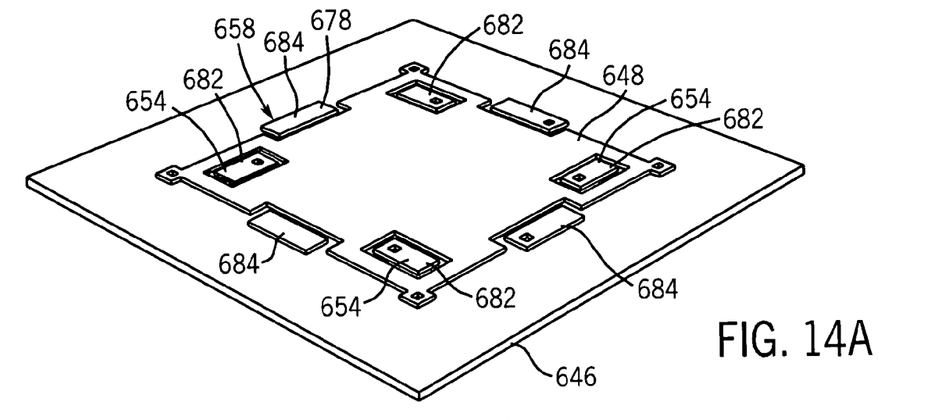
FIGS. 14A-14I are perspective views illustrating a method of making a pixel of a light modulator according to one exemplary embodiment.
Figure 14B:
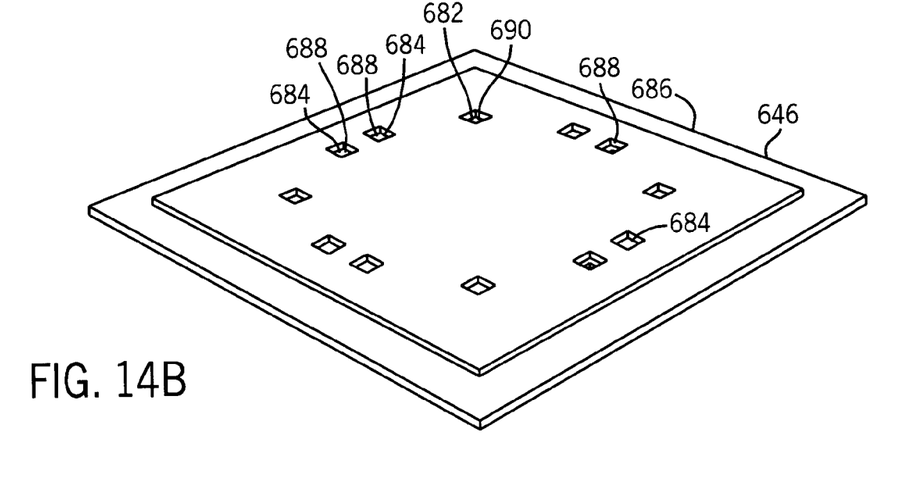
Figure 14C:
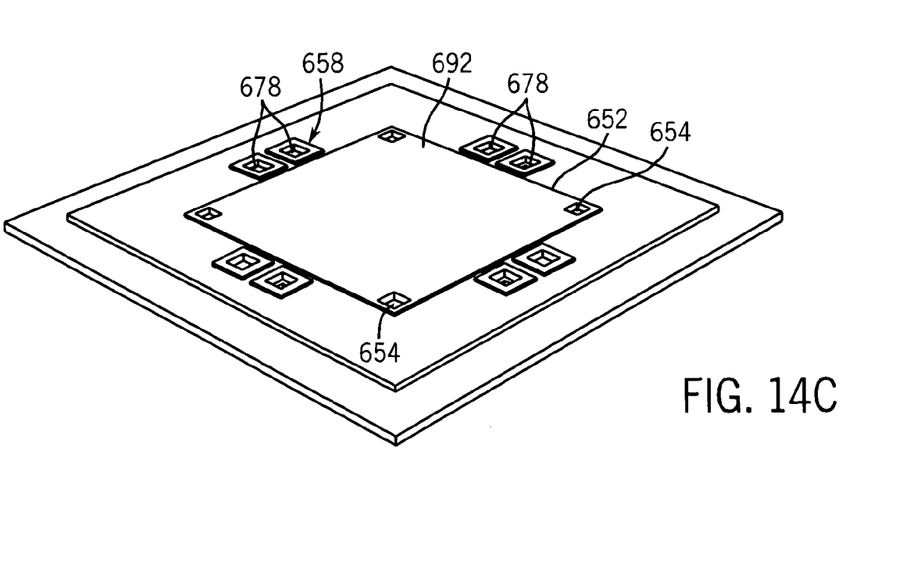
Figure 14D:
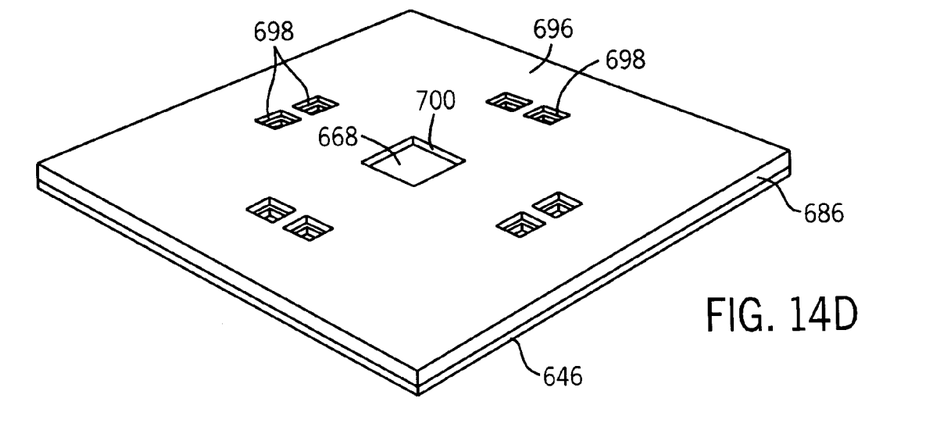
Figure 14E:
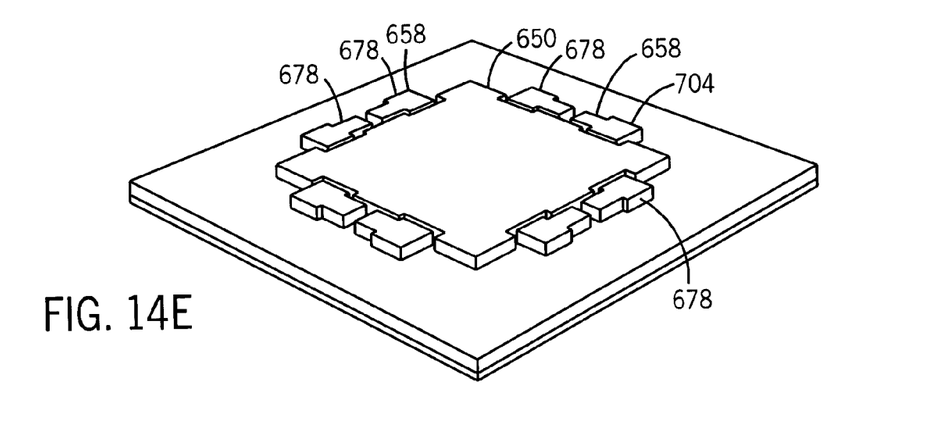
Figure 14F:
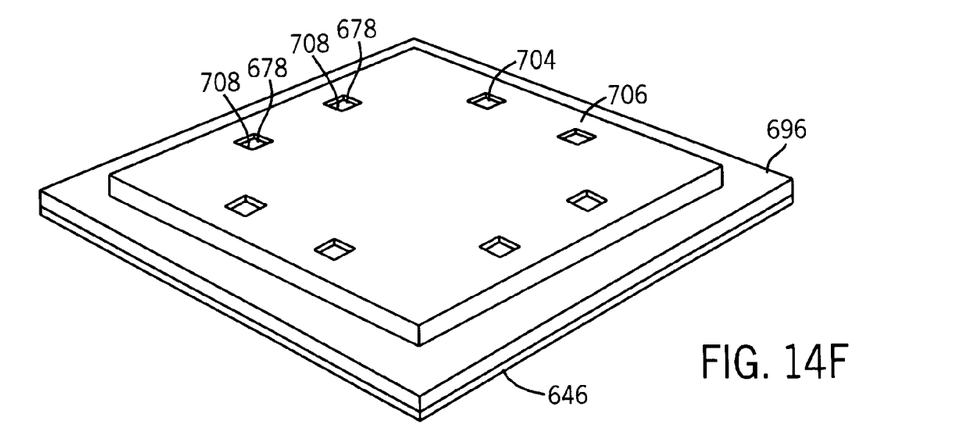
Figure 14G:
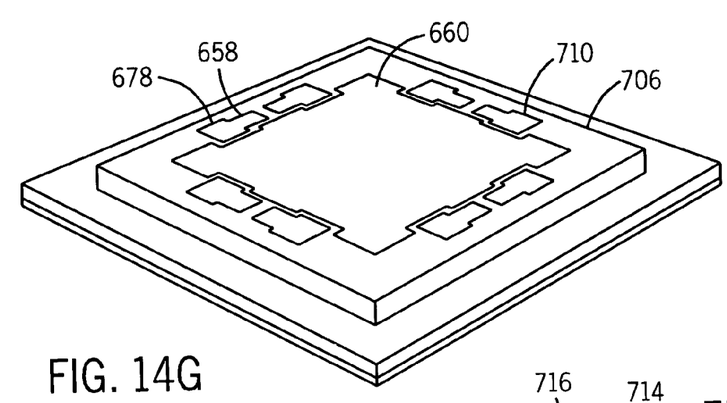
Figure 14H:
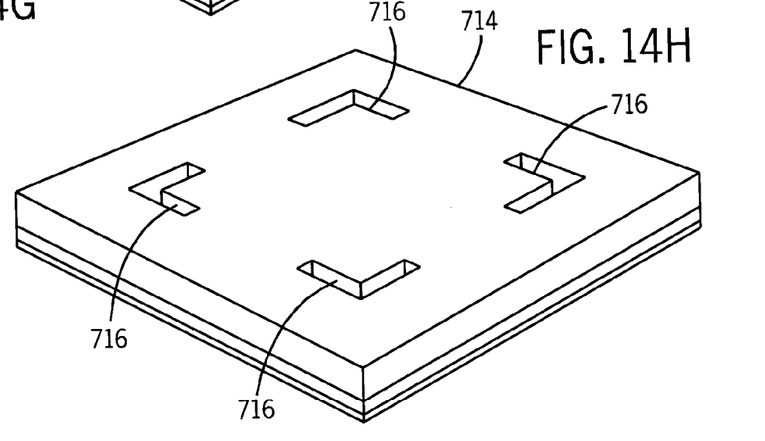
Figure 14I:
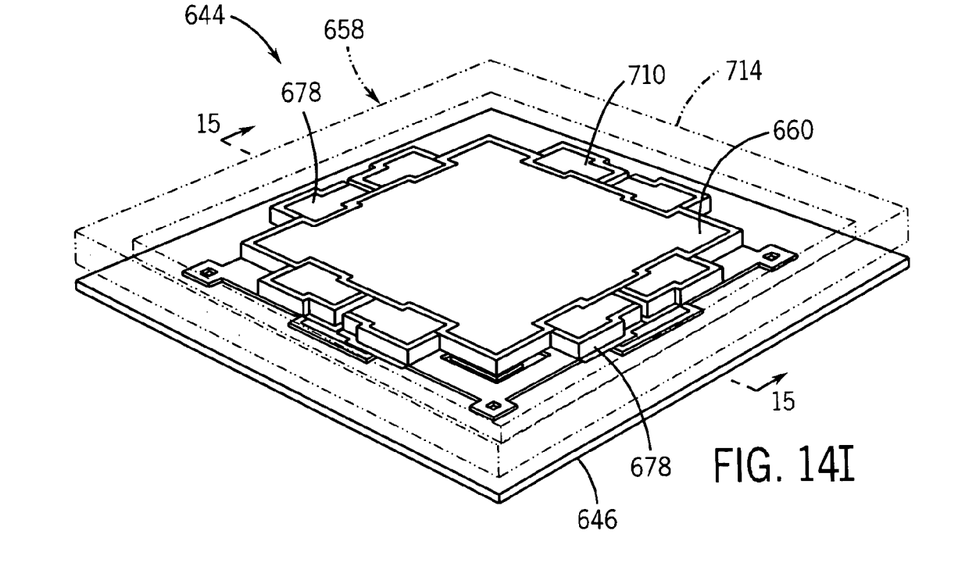
Figure 15:
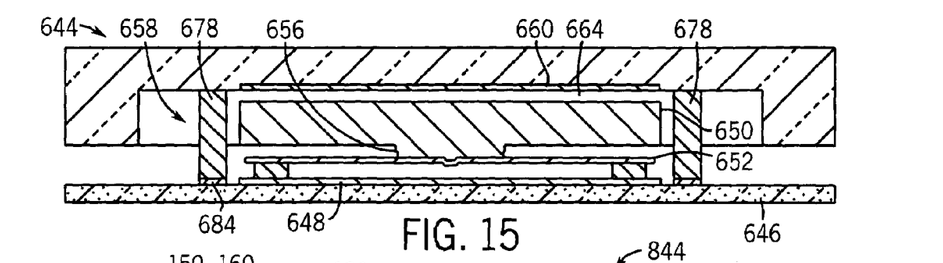
FIG. 15 is a sectional view of the light modulator of FIG. 14I taken along line 15-15 according to one exemplary embodiment.

FIGS. 14A-14I illustrate a process or method of making an individual pixel 644 (shown in FIG. 14I and FIG. 15). As shown in FIG. 14A, plate 648 is formed upon a substrate 646 by depositing electrically conductive material upon substrate 646, applying a photoresist pattern over the layer of conductive material and etching the layer of conductive material. Portions 682 of the layer of material form part of outer post 654 while portions 684 of the layer of material form part of posts 678 of support 658. In the particular example shown, the layer of conductive material comprises 50 angstroms of Ti, 500 angstroms of TiN and 1500 angstroms of AlCu. In other embodiments, a greater or fewer number of layers of conductive material may be used to form plate 648.

As shown by FIG. 14B, a sacrificial layer 686 is formed over plate 648 and portions 682, 684. A photoresist in the pattern shown is formed over the sacrificial layer and the sacrificial layer 686 is etched to form openings 688, 690. Openings 688 extend through layer 686 to portions 684. Openings 690 extend through layer 686 to portions 682. According to one exemplary embodiment, sacrificial layer 686 comprises a 200 angstrom layer of TEOS.

As shown by FIG. 14C, layer 692 is deposited upon layer 686, has a pattern photoresist applied to it and is etched to form flexure 652 and to further build up outer post 678 of support 658. Portions of layer 692 which form flexure 652 pass through openings 690 (shown in FIG. 14B) and are joined to plate 648 to form outer posts 654. According to one exemplary embodiment, layer 692 comprises a 1200 angstrom layer of TaAl.

As shown by FIG. 14D, a sacrificial layer 696 is deposited over substrate 646, over layer 686 and over layer 692. Layer 696 has a photoresist in the pattern shown in FIG. 14D applied and is etched to form openings 698 and 700. Openings 698 extend through layers 696 to portions of layer 692 forming a part of post 678. Opening 700 extends through layer 696 to a central portion 668 of flexure 652 formed by layer 692. In the particular example shown, layer 692 comprises a 200 angstrom layer of SiN material.

As shown by 14E, a layer 704 of electrically conductive reflective material is deposited upon layer 696 and over openings 698, 700. A photoresist having the pattern shown in FIG. 14E is applied to layer 704 and layer 704 is etched to form pixel plate 650 and to further build up posts 678 of support 658. According to one exemplary embodiment, layer 704 comprises a 10,000 angstrom thick layer of AlCu.

As shown by FIG. 14F, a sacrificial layer 706 is deposited over layer 696 and over layer 704. A photoresist in the pattern shown in FIG. 14F is applied to layer 706 and layer 706 is etched to form openings 708. Openings 708 extend through layer 706 to those portions of layer 704 forming post 678. According to one exemplary embodiment, layer 706 comprises SiN and has a thickness of about 200 angstroms.

As shown by FIG. 14G, a layer 710 of electrically conductive semi-reflective and semi-transparent material is deposited upon layer 706. A photoresist having the pattern shown in FIG. 14G is applied to layer 706 and layer 710 and layer 710 is etched to form plate 660 and to further build up posts 678 of support 658. According to one exemplary embodiment, layer 710 comprises TaAl having a thickness of about 100 angstroms.

As shown by FIG. 14H, a layer 714 of at least partially transparent material is deposited over sacrificial layer 696, 706 and over layer 710 (shown in FIG. 14G). A photoresist in the pattern shown in FIG. 14H is applied to layer 714 and layer 714 is etched to form openings 716 which extend through layer 714 to layer 706. According to one exemplary embodiment, layer 714 comprises TIOS having a thickness of about 10,000 angstroms.

As shown by FIG. 14I and FIG. 15, a cross-sectional view of FIG. 14I, pixel 644 is completed by etching away sacrificial layers 706, 696 and 686 through openings 716. Openings 716 are then corked or filled. According to one exemplary embodiment, openings 716 are corked with 2 to 3 micrometers of undoped silicate glass (USG).

The resulting pixel 644 includes a pixel plate 650 movably supported by a flexure 652. The flexure 652 is connected or clamped on one side to pixel plate 650 at a central location by post 656 and has an opposite side connected or clamped to an underlying structure (plate 648) at least one outer location by posts 654 (shown in FIG. 14A). Pixel plate 650 is spaced from plate 660 to form an optical cavity 664. During use of pixel 644, light passes through plate 660 and is reflected by pixel plate 650. The light reflected from pixel plate 650 is further partially reflected by plate 658. Movement of pixel plate 650 enables the thickness of the optical cavity 664 to be adjusted to control interference and to control the color and intensity of the light emitted from pixel 644.

The process described above with respect to FIGS. 14A-14I is but one example of a method for making pixel 644. Alternative materials and materials having alternative thicknesses may alternatively be utilized to form pixel 644. In the particular example shown, materials are deposited using chemical vapor deposition and sputtering. In other embodiments, other deposition techniques such as electroplating may be employed. In lieu of etching, other material removal techniques such as ablation or other techniques may alternatively be used. Although not shown, electrical connections or traces to plates 648, 650 and 660 may additionally be formed during the formation of pixel 644. The process may additionally include forming one or more switching mechanisms, such as CMOS transistors, upon or within substrate 646. Such switching mechanisms may facilitate the biasing of one or more of plates 648, 650 and 660 to distinct voltages to electrostatically move pixel plate 650.

Figure 16:
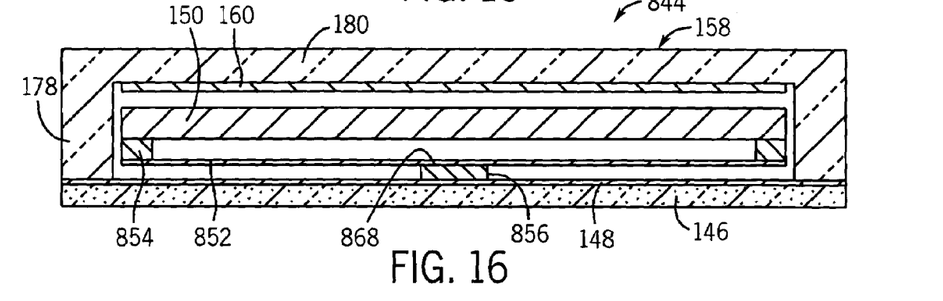
FIG. 16 is a sectional view of another embodiment of the pixel of FIG. 3 according to one exemplary embodiment.
Figure 17:
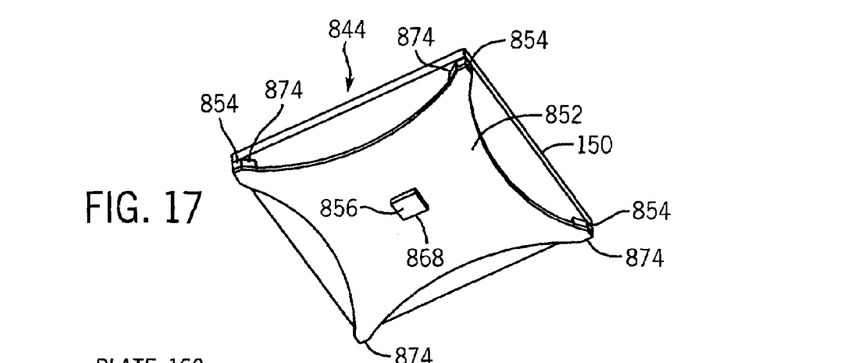
FIG. 17 is a bottom perspective view of a flexure system connected to a pixel plate of the pixel of FIG. 16 according to one exemplary embodiment.

FIGS. 16 and 17 illustrate pixel 844. Pixel 844 is similar to pixel 144 except that pixel 844 includes flexure system 851 having flexure 852, outer post 854 and central post 856 in lieu of flexure 152, outer supports 154 and central support 156. Those remaining elements of pixel 844 which are similar to corresponding components of pixel 144 are numbered similarly. As shown by FIG. 17, flexure 852 has a generally hypocycloid shape. Corners 874 of flexure 852 are connected to pixel plate 150 by outer posts 854. A central portion 868 of flexure 852 is connected to an underlying structure provided by plate 148 (shown in FIG. 16). Like flexure 152, outer supports 154 and central support 156, flexure 852, outer post 854 and central post 856 form a flexure arrangement which movably support pixel 150 during adjustment of the thickness of the optical cavity formed between pixel plate 150 and plate 160.

Figure 18:
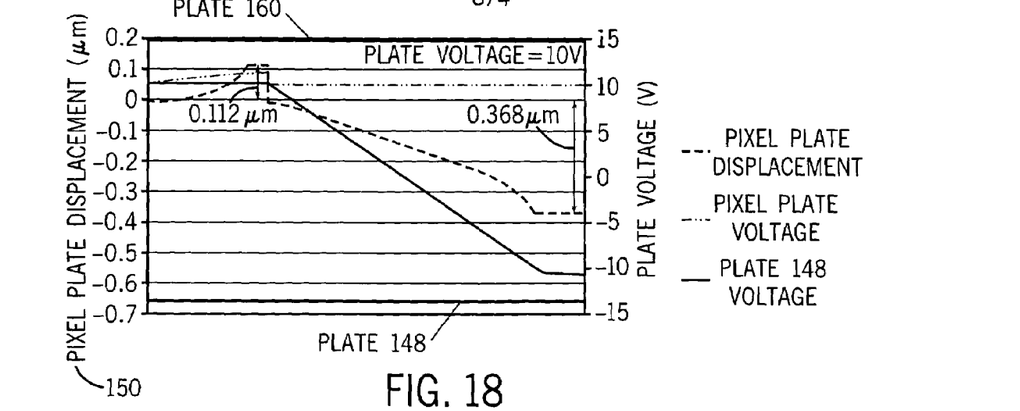
FIG. 18 is a graph illustrating a scheme for operating the pixel of FIG. 16 according to one exemplary embodiment.

FIG. 18 is a graph illustrating one example method for repositioning pixel plate 150 to adjust the optical cavity of pixel 844. As shown in FIG. 18, plates 148, 150 and 160 are each initially set at 10 volts. To move pixel plate 150 towards plate 160, pixel plate 150 is ramped up to 11.1 volts while the voltages of plates 148 and 160 are kept at 10 volts. The induced upward displacement of pixel plate 150 is 0.1025 micrometers (approximately 51% of the total upper electrostatic gap between plates 150 and 160). To move pixel plate 150 downward towards plate 148, the voltage of pixel plate 150 is reset to 10 volts while the voltage of plate 148 is ramped down to negative 10.4 volts to induce a downward displacement of 0.368 micrometers (approximately 56% of the total lower electrostatic gap between plate 150 and plate 148). In both cases, contact between pixel plate 150 and plates 148 and 160 is avoided.

The particular pixel 844 from which the results of FIG. 18 were taken has a flexure 852 formed from TaAl with a residual stress of 20 MPa. Pixel plate 150 is formed from AlCu with a residual stress of 200 MPa. Pixel plate 150 and flexure 852 have thicknesses of 1 micrometer and 0.05 micrometers, respectively. Pixel plate 150 has a dimension of 20×20 micrometers. The upper electrostatic gap or optical cavity between pixel plate 150 and plate 160 is 0.2 micrometers. The lower electrostatic gap formed between a lower surface of pixel plate 150 and plate 148 is 0.66 micrometers.

Like flexure system 151 of pixel 144 provided by flexure 152, outer posts 154 and central posts 156, flexure system 851 of pixel 844 provided by flexure 852, outer post 854 and central post 856 movably supports pixel plate 150 with the reduced risk of stiction and with lesser induced strains in the flexure itself. Flexure system 851 enables controlled movement of pixel plate 150 through a large fraction (approximately 50-60%) of the total electrostatic gap (i.e., the distance between plates 148 and 160) without any contact between pixel plate 150 and plate 160 or between flexure 52 and plate 148. Flexure system 851 also enables pixel plate 150 to be pulled upward towards plate 160 to within 1,000 angstroms of plate 160 to achieve the display of a black color without losing pixel stability and without contact between pixel plate 150 and plate 160. In addition, because movement of pixel plate 150 downward towards plate 148 is approximately linear for almost 50-60% of the total electrostatic gap between plates 148 and 150, flexure system 851 provides for stability and control of the movement of pixel plate 150 and for control over the color of light emitted from pixel 844. In addition, flexure system 851 incurs lower induced strains and has enhanced manufacturability.

Like flexure 152, flexure 852 may have other shapes. For example, in lieu of being a hypocycloid, flexure 852 may alternatively be rectangular or square in shape such as shown in FIG. 5, may be triangular in shape such as shown in FIG. 12, may be circular in shape such as shown in FIG. 13 or may be circular in shape such as shown in FIG. 13. In lieu of comprising four posts attached to the corners of flexure 852, outer posts 854 may alternatively comprise a fewer or greater number of such posts located outwardly beyond central portion 868 of flexure 852. In lieu of comprising a plurality of spaced supports, outer posts 854 may alternatively comprise a single continuous post that extends about central portion 868. For example, outer posts 854 may alternatively comprise a single continuous post such as shown in FIG. 9 which continuously connects an outer periphery of flexure 852 to pixel plate 150. In lieu of comprising a single post, central post 856 may alternatively include a plurality of spaced posts, such as shown in FIG. 12, connecting flexure 852 to an underlying support structure such as plate 148 or substrate 146.

Although the present invention has been described with reference to exemplary embodiments, workers skilled in the art will recognize that changes may be made in form and detail without departing from the spirit and scope of the invention. For example, although different exemplary embodiments may have been described as including one or more features providing one or more benefits, it is contemplated that the described features may be interchanged with one another or alternatively be combined with one another in the described exemplary embodiments or in other alternative embodiments. Because the technology of the present invention is relatively complex, not all changes in the technology are foreseeable. The present invention described with reference to the exemplary embodiments and set forth in the following claims is manifestly intended to be as broad as possible. For example, unless specifically otherwise noted, the claims reciting a single particular element also encompass a plurality of such particular elements.

What is claimed is:

1. An apparatus comprising:
a first member;
a second member;

a flexure having a central portion connected to the first member, outer portions connected to the second member and an intermediate portion spaced from the first member and the second member, wherein portions of the flexure are spaced from the first member and the second member in a direction perpendicular to the flexure.

2. The apparatus of claim 1, wherein the first member is electrically conductive.

3. The apparatus of claim 2, wherein the second member is electrically conductive.

4. The apparatus of claim 1, wherein the flexure is circular.

5. The apparatus of claim 2, wherein the flexure is rectangular.

6. The apparatus of claim 1, wherein the flexure is a hypocycloid.

7. The apparatus of claim 1, wherein the flexure is triangular.

8. The apparatus of claim 1, wherein the flexure and the second member are connected so as to prevent contact between the central portion and the second member.

9. The apparatus of claim 1 including a spacer spacing the flexure from the second member.

10. The apparatus of claim 9, wherein the spacer interconnects the flexure and the second member.

11. The apparatus of claim 1 including at least three spaced spacers spacing the flexure and the second member.

12. The apparatus of claim 1, wherein the first member has a reflective surface.

13. The apparatus of claim 12 including a third member, wherein the third member is at least semi-transparent and wherein the first member is between the second member and the third member.

14. The apparatus of claim 13, wherein the third member is electrically conductive.

15. The apparatus of claim 12, wherein the reflective surface is no greater than about 400 square micrometers.

16. The apparatus of claim 1 including a third member between the first member and the flexure, wherein the third member is electrically conductive.

17. The apparatus of claim 1, wherein the second member has a reflective surface.

18. The apparatus of claim 17 including a third member, wherein the third member is semi-transparent and wherein the second member is between the first member and the third member.

19. The apparatus of claim 18, wherein the third member is electrically conductive.

20. The apparatus of claim 17, wherein the reflective surface is no greater than 400 micrometers squared.

21. The apparatus of claim 1, wherein the flexure is formed from at least one of a group of materials including:
TaAl, $Al_3Ti$.

22. The apparatus of claim 1, wherein the first member is formed from at least one of a group of materials including:
AlCu, Al, Ag, Au and their alloys, dielectric and metal/dielectric composite thin film stacks.

23. The apparatus of claim 1, wherein one of the first member and the second member includes a reflective surface and wherein the apparatus includes a light source configured to direct light upon the reflective surface.

24. The apparatus of claim 23 including at least one lens through which reflected light from the reflective surface passes.

25. The apparatus of claim 24 including at least one lens between the light source and the reflective surface.

26. The apparatus of claim 1 including a voltage source configured to electrically bias at least one of the first member and the second member to a non-zero voltage.

27. The apparatus of claim 1, wherein the flexure has a stiffness of no greater than 15 micro newtons per micrometer.

28. The apparatus of claim 27, wherein the flexure has a stiffness of at least 7 micro newtons per micrometer.

29. The apparatus of claim 1, wherein the flexure has a thickness of between about 200 angstroms and 600 angstroms.

30. The apparatus of claim 1, wherein the outer portions of the flexure connected to the second member continuously extend about the central portion.

31. The apparatus of claim 1, wherein the outer portions of the flexure connected to the second member are spaced from one another about the central portion.

32. The apparatus of claim 1, wherein the central portion of the flexure connected to the first member is equidistantly spaced from the outer portions of the flexure that are connected to the second member.

33. The apparatus of claim 1, wherein the first member, the second member and the flexure are integrally formed as part of a single unitary body.

34. The apparatus of claim 1 including a central via connecting the flexure to the first member and at least one outer via connecting the outer portions of the flexure to the second member.

35. The apparatus of claim 34, wherein the at least one outer via and the flexure are formed from a first common material and wherein the central via and the first member are formed from a second common material.

36. The apparatus of claim 1, wherein the flexure comprises a membrane.

37. The apparatus of claim 1, wherein the flexure includes legs, wherein first portions of the legs converge towards one another and are connected to the first member and second portions connected to the second member.

38. The apparatus of claim 37, wherein the first portions have ends spaced from one another.

39. The apparatus of claim 1, wherein the intermediate portion extends on opposite sides of the central portion and wherein the flexure movably supports the first member relative to the second member.

40. An apparatus comprising:
a first member;
a second member;
a flexure having a central portion connected to the first member, outer portions connected to the second member and an intermediate portion spaced from the first member and the second member, wherein the first member has a reflective surface.

41. The apparatus of claim 40 including a third member, wherein the third member is at least semi-transparent and wherein the first member is between the second member and the third member.

42. The apparatus of claim 41, wherein the third member is electrically conductive.

43. An apparatus comprising:
a first member;
a second member;
a flexure having a central portion connected to the first member, outer portions connected to the second member and an intermediate portion spaced from the first member and the second member; and
a third member between the first member and the flexure, wherein the third member is electrically conductive.

44. An apparatus comprising:
a first member;
a second member;
a flexure having a central portion connected to the first member, outer portions connected to the second member and an intermediate portion spaced from the first member and the second member, wherein the second member has a reflective surface.

45. The apparatus of claim 44 including a third member, wherein the third member is semi-transparent and wherein the second member is between the first member and the third member.

46. The apparatus of claim 45, wherein the third member is electrically conductive.

47. The apparatus of claim 44, wherein the reflective surface is no greater than 400 micrometers squared.

48. An apparatus comprising:
a first member;
a second member;
a flexure having a central portion connected to the first member, outer portions connected to the second member and an intermediate portion spaced from the first member and the second member, wherein the flexure is formed from at least one of a group of materials including:
TaAl, $Al_3Ti$.

49. An apparatus comprising:
a first member;
a second member;
a flexure having a central portion connected to the first member, outer portions connected to the second member and an intermediate portion spaced from the first member and the second member, wherein one of the first member and the second member includes a reflective surface and wherein the apparatus includes a light source configured to direct light upon the reflective surface.

50. The apparatus of claim 49 including at least one lens through which reflected light from the reflective surface passes.

51. The apparatus of claim 50 including at least one lens between the light source and the reflective surface.

52. An apparatus comprising:
a first member;
a second member;
a flexure having a central portion connected to the first member, outer portions connected to the second member and an intermediate portion spaced from the first member and the second member; and
a voltage source configured to electrically bias at least one of the first member and the second member to a non-zero voltage.

53. An apparatus comprising:
a first member;
a second member;
a flexure having a central portion connected to the first member, outer portions connected to the second member and an intermediate portion spaced from the first member and the second member, wherein the flexure includes legs, wherein first portions of the legs converge towards one another and are connected to the first member and second portions connected to the second member.

* * * * *